United States Patent
Pellizzer et al.

(10) Patent No.: US 6,989,580 B2
(45) Date of Patent: *Jan. 24, 2006

(54) PROCESS FOR MANUFACTURING AN ARRAY OF CELLS INCLUDING SELECTION BIPOLAR JUNCTION TRANSISTORS

(75) Inventors: Fabio Pellizzer, Follina (IT); Giulio Casagrande, Vignate (IT); Roberto Gastaldi, Agrate Brianza (IT); Loris Vendrame, Carbonera (IT); Augusto Benvenuti, Lallio (IT); Tyler Lowrey, Rochester Hills, MI (US)

(73) Assignees: STMicroelectronics S.r.l., Agrate Brianza (IT); Ovonyx, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/680,721

(22) Filed: Oct. 7, 2003

(65) Prior Publication Data

US 2004/0130000 A1 Jul. 8, 2004

(30) Foreign Application Priority Data

Oct. 8, 2002 (EP) ................................. 02425604

(51) Int. Cl.
   *H01L 29/70* (2006.01)
(52) U.S. Cl. ...................... 257/577; 257/566
(58) Field of Classification Search ................ 257/565, 257/566, 577, 539, E31.029
   See application file for complete search history.

(56) References Cited

U.S. PATENT DOCUMENTS

| | | | |
|---|---|---|---|
| 4,180,866 A | 12/1979 | Shanks | 365/186 |
| 4,981,807 A | 1/1991 | Jambotkar | 437/31 |
| 5,262,670 A | 11/1993 | Lee et al. | 257/577 |
| 5,276,638 A | 1/1994 | Wong | 365/156 |
| 5,789,758 A * | 8/1998 | Reinberg | 257/3 |
| 6,403,436 B1 * | 6/2002 | Tanomura | 438/312 |
| 6,434,041 B2 | 8/2002 | Forbes | 365/177 |
| 6,437,383 B1 | 8/2002 | Xu | 257/300 |
| 6,531,373 B2 * | 3/2003 | Gill et al. | 438/400 |
| 6,573,586 B2 * | 6/2003 | Sakata et al. | 257/529 |
| 6,649,928 B2 * | 11/2003 | Dennison | 257/4 |
| 2002/0079483 A1 | 6/2002 | Dennison | 257/5 |
| 2004/0041236 A1 * | 3/2004 | Forbes | 257/577 |

OTHER PUBLICATIONS

U.S. Appl. No. 10/680,727, filed Oct. 7, 2003, Pellizer et al.

* cited by examiner

*Primary Examiner*—Jerome Jackson
*Assistant Examiner*—N. Drew Richards
(74) *Attorney, Agent, or Firm*—Lisa K. Jorgenson; Robert Iannucci; Seed IP Law Group PLLC (57) ABSTRACT

A process for manufacturing an array of cells, including: implanting, in a body of semiconductor material of a first conductivity type, a common conduction region of the first conductivity type; forming, in the body, above the common conduction region, a plurality of active area regions of a second conductivity type and a first doping level; forming, on top of the body, an insulating layer having first and second openings; implanting first portions of the active area regions through the first openings with a doping agent of the first conductivity type, thereby forming, in the active area regions, second conduction regions of the first conductivity type; implanting second portions of the active area regions through the second openings with a doping agent of the second conductivity type, thereby forming control contact regions of the second conductivity type and a second doping level, higher than the first doping level; forming, on top of the body, a plurality of storage components, each storage component having a terminal connected to a respective second conduction region.

28 Claims, 7 Drawing Sheets

PROCESS FOR MANUFACTURING AN ARRAY OF CELLS INCLUDING SELECTION BIPOLAR JUNCTION TRANSISTORS

BACKGROUND OF THE INVENTION

1. Field of the Invention

The present invention relates to a process for manufacturing an array of cells including selection bipolar junction transistors. In particular, the invention refers to a memory array of a phase change memory (PCM) device, without being limited thereto.

2. Description of the Related Art

As is known, phase change memory cells utilize a class of materials that have the unique property of being reversibly switchable from one phase to another with measurable distinct resistivity. Specific materials that may be suitably used in phase change memory cells are alloys of elements of the VI group of the periodic table as Te or Se, also called chalcogenides or chalcogenic materials. Thus a thin film of chalcogenic material may be employed as a programmable resistor, switching between a high and a low resistance condition.

The use of chalcogenic storage elements has been already proposed to form a memory cell. To avoid disturbances caused by adjacent memory cells, the chalcogenic element is generally coupled with a selection element, generally a MOS transistor or a diode.

Figure 1:
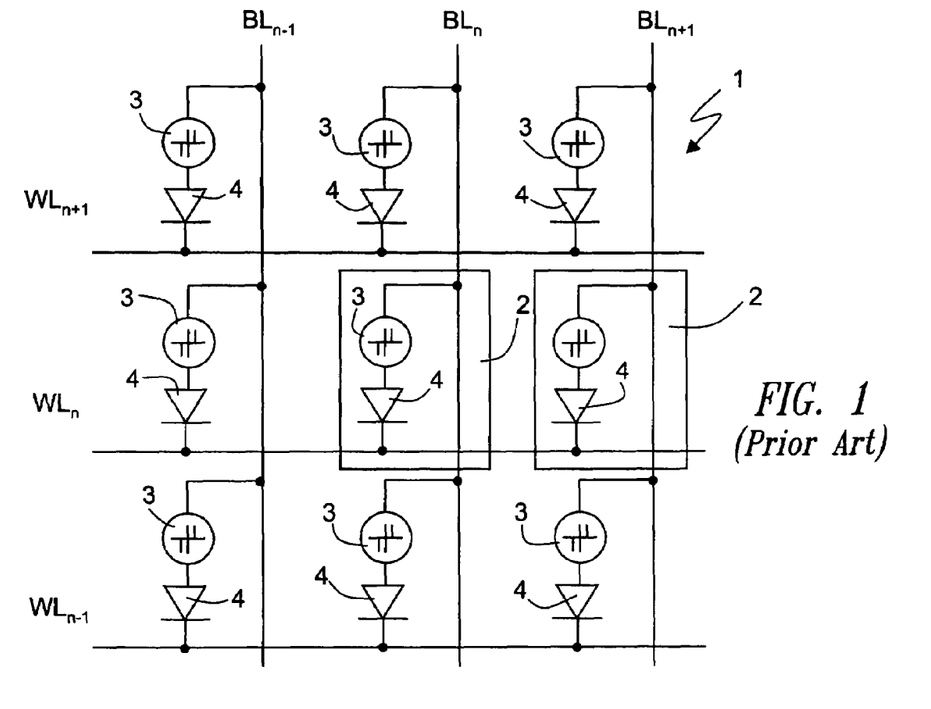
FIG. 1 illustrates a circuit diagram of a known array of phase change memory cells.

A possible organization of a PCM array is shown in FIG. 1. The memory array 1 of FIG. 1 comprises a plurality of memory cells 2, each including a storage element 3 of the phase change type and a selection element 4 formed here as a diode.

The memory cells 2 are arranged on rows and columns. In each memory cell 2, the storage element 3 has a first terminal connected to an own bit line BLn−1, BLn, BLn+1, . . . , and a second terminal connected to an anode of the diode 4; the diode 4 has a cathode connected to an own word line WLn−1, WLn, WLn+1, . . .

In order to address the storage element 3 belonging to a specific cell 2, for example the one connected to bit line BLn and to world line WLn, the bit line connected to the addressed cell (selected bit line BLn) is biased at a high voltage $V_{OP}$ and all the other (unselected) bit lines BLn−1, BLn+1, . . . are grounded. Furthermore, the word line connected to the addressed cell (selected word line WLn) is grounded and all the other (unselected) word lines WLn−1, WLn+1, . . . are biased at $V_{CC}$, so that only the diode 4 connected to the selected word line and bit line is on.

CMOS compatible processes for manufacturing PCM have been already proposed, wherein the diodes are integrated in a P-type substrate wherein N-type regions are formed. The N-type regions, defining the cathode of the diodes, are contacted by a metal line and form wordlines of the array. The N-type regions accommodate P-type regions that define the anodes of the diodes and are connected to long stripes of chalcogenic material at small portions thereof defining the storage elements. The stripes of chalcogenic material extend perpendicular to the wordlines and define bitlines of the array.

Because of this structure, the diodes are associated with parasitic bipolar transistors having emitters formed by the diode anodes and connected to the bitlines (here, bitline BLn); bases formed by the diode cathodes and connected to the wordlines (here, wordline WLn); and collectors formed by the substrate. The equivalent electric diagram of a real cell is shown of FIG. 2.

Figure 2:
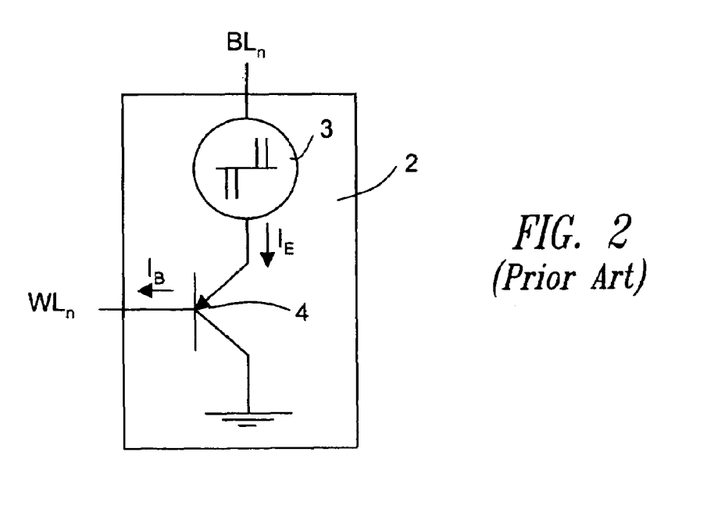
FIG. 2 shows an equivalent actual electric diagram of a memory cell of the array of FIG. 1.

In practice, selection of a cell 2 is done by driving the bipolar transistor 4 in the active region and biasing the base-emitter junction in direct mode. Therefore, the actual current $I_B$ supplied by the base terminal is not equal to the current $I_E$ flowing through the emitter terminal, but is defined by the following relationship:

$$I_B = I_E/(1+\beta_F)$$

wherein $\beta_F$ is the current gain of the bipolar transistor.

The presence of these parasitic transistors causes some problems, mainly due to the high currents flowing in particular during a modify (set, reset) operation. Indeed, usually a write operation is performed on a number of cells on a single wordline (eight or sixteen cells, or even more) so that the total current flowing through the selected wordline and in the decoder drive pull-down transistor is the sum of the currents of the cells. This poses an upper limit to the number of cells that can be modified in a single operation, because the voltage drop across the selected wordline and the pull-down transistor becomes unacceptable.

Indeed, during a modify operation, a current in the range of 200 μA flows through the emitter terminal of each bipolar transistor 4. Since, as said, eight or sixteen cells connected to a same wordline are modified at the same time, the total current entering the emitters of the selected transistors is 1.6–3.2 mA.

Since in known memory arrays the bipolar transistor is not exploited, but instead it is considered a parasitic element, its design is not optimized, so that its current gain $\beta_F$ is much less than 1, the current flowing in the selected wordline is about the same as the total emitter current (1.6–3.2 mA, as above discussed); this current flows along the entire wordline and in the pull-down transistor of the row decoder, causing an unacceptable voltage drop.

BRIEF SUMMARY OF THE INVENTION

An embodiment of this invention provides a manufacturing method allowing integration of a bipolar transistor in a cell array so as to overcome the above-indicated drawbacks.

According to one aspect of the invention, the bipolar transistor operating as a selection element of an array of memory cells is formed in a semiconductor body including some distinct regions: a substrate of P-type; a subcollector region, of P-type, overlying the substrate; a collector region of P-type, overlying the subcollector region; a base region, of N-type, overlying the collector region; an emitter region, of P-type, housed in the base region; and a base contact. The emitter region and the base contact are contacted through contacts formed in a dielectric layer grown over the semiconductor body and are implanted after depositing the dielectric layer, or at least a lower portion thereof and opening the contacts, using an own mask. Thereby no misalignment of the emitter and base contact masks may cause short-circuits between the emitter and base contact regions.

According to another aspect of the invention, the doping of each of the regions forming the bipolar transistors is optimized as regards driving capability, leakage immunity, and low voltage requirement.

BRIEF DESCRIPTION OF THE SEVERAL VIEWS OF THE DRAWINGS

For the understanding of the present invention, preferred embodiments are now described, purely as a non-limitative examples, with reference to the enclosed drawings, wherein.

DETAILED DESCRIPTION OF THE INVENTION

A simple solution to the unacceptable voltage drop in prior art PCM memory devices is that to divide the wordlines, introducing four or eight local drivers driving two bits as a maximum.

However, this solution increases the complexity of the memory device, the required area and thus the unitary costs of the memory device.

Another solution of the above problem resides in maximizing the current gain $\beta_F$, so as to minimize the current flowing in the selected wordline and the pull-down transistor; thereby reducing the dimensions of the local driver or conversely the number of the local drivers to two or four, each local driver driving four bits.

However, the manufacture of a bipolar transistor as a selection element in a memory array with low current gain implies some problems. First of all, the process should be such as to avoid any possible shorting of the emitters and the base contacts in case of misalignments, even when the cell pitch is particularly tight.

Furthermore, a high current gain requires a very low base doping, leading to a high base resistance. Since the base is also the wordline of the array, both delay time and voltage drop along the wordline would be increased. Not least, a high current flowing into the substrate can give rise to injection problems that must be carefully handled. All these problems require an accurate optimization of the manufacturing process and a tradeoff between conflicting requirements.

Figure 3:
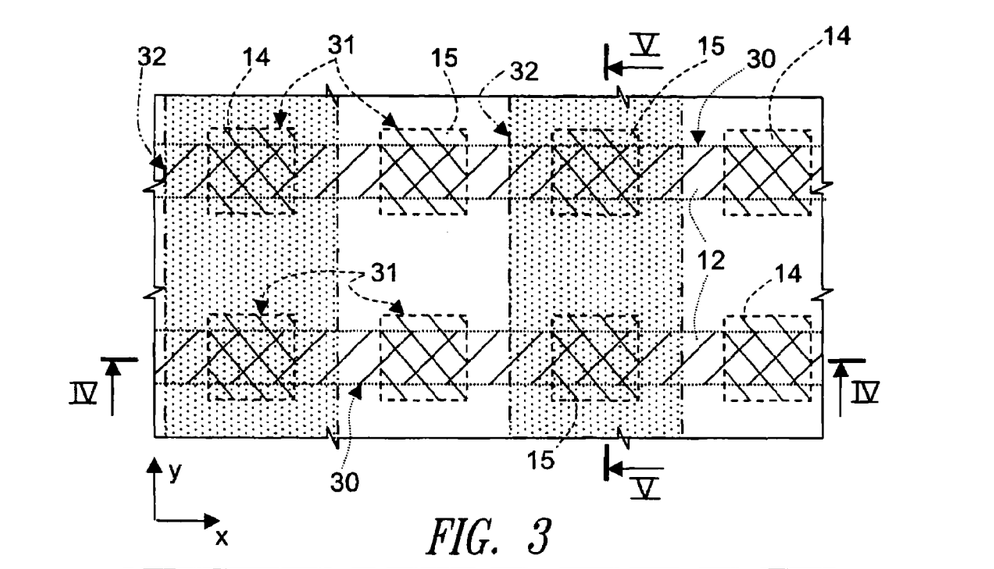
FIG. 3 shows the masks used for manufacturing a bipolar transistor according to a first embodiment of the invention.
Figure 4:
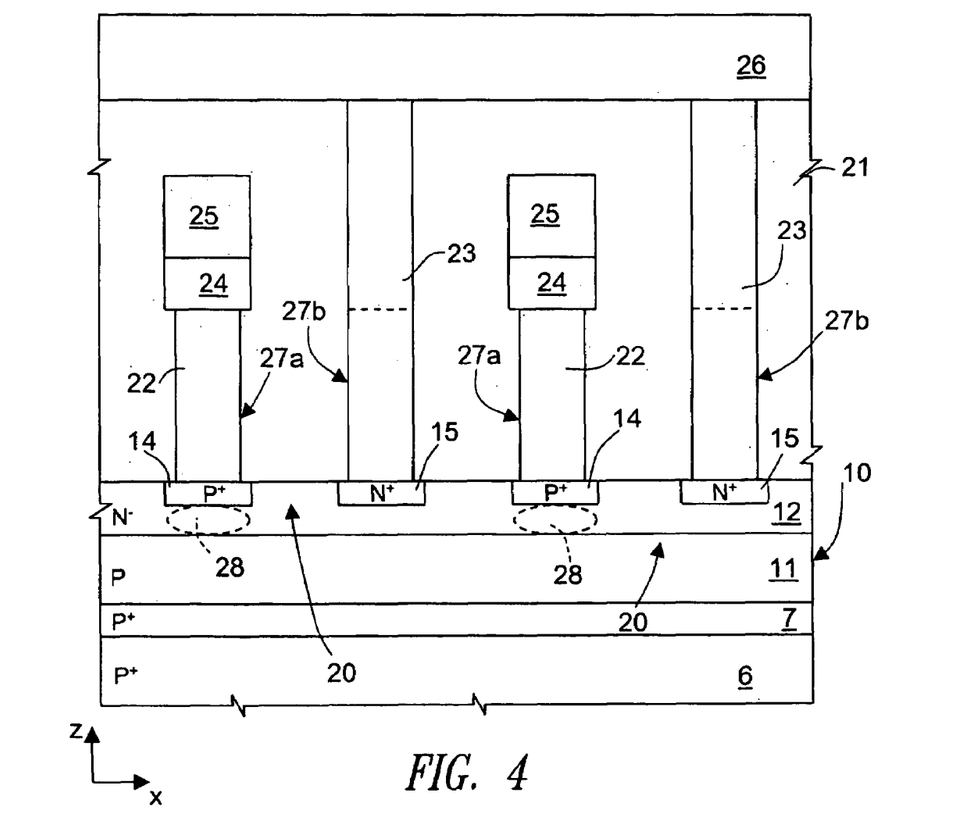
FIG. 4 shows a cross-section of the first embodiment, taken along line IV—IV of FIG. 3.
Figure 5:
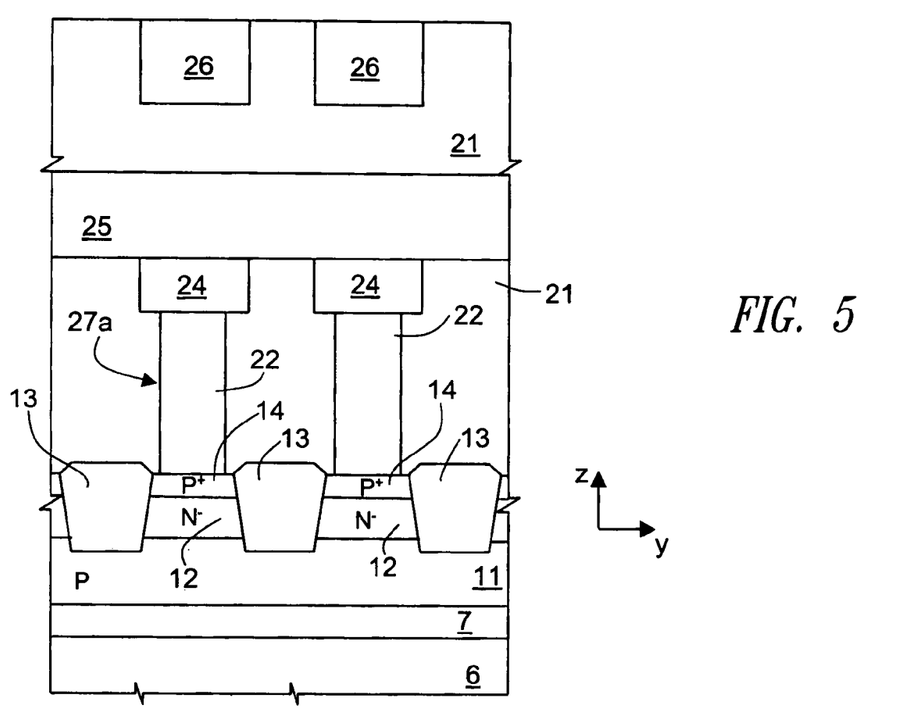
FIG. 5 shows a cross-section of the first embodiment, taken along line V—V of FIG. 3.

According to the embodiment of FIGS. 3–5, a memory array is formed in a body 10 of semiconductor material including a heavily doped substrate 6 of P-type. A subcollector region 7, also of P-type and high doping level, extends above the substrate 6 in an epitaxial layer. A common collector region 11, of P-type and lower doping level than the subcollector region 7, extends on the substrate 6, also in the epitaxial layer. The epitaxial layer also houses a plurality of active area strips 12, of N-type, defining base regions. The active area strips 12 extend parallel to each other along a first direction (X-direction) and are electrically insulated from each other by field oxide regions 13 (FIG. 5).

Each active area strip 12 accommodates a plurality of emitter regions 14, of $P^+$-type, and a plurality of base contact regions 15, of $N^+$-type, that are arranged alternately, that is each emitter region 14 is arranged between two base contact regions 15, and each base contact region 15 is arranged between two emitter regions 14. Thus, each pair of regions including an emitter region 14 and the adjacent base contact region 15 (for example, an emitter region 14 and the base contact region 15 arranged on right thereof, the active area strip 12 they are accommodated in, and the underlying common collector region 11 form a selection transistor 20 of PNP-type, corresponding to bipolar transistor 4 of FIG. 2.

A dielectric region 21 extends on the body 10 and accommodates contacts, storage elements and interconnection lines. The dielectric region 21 is generally formed by more layers deposited subsequently to allow forming the various regions therein and may also include different materials.

First and second contacts 22, 23 extend in first and second openings 27a, 27b of the dielectric region 21. Preferably, the first and second contacts 22, 23 are of tungsten, covered on the vertical and bottom sides with a barrier material (for example, Ti/TiN), not shown for simplicity.

The first contacts 22 extend each from an emitter region 14 to a chalcogenic storage element 24 forming the storage element 3 of FIG. 1. First metal lines 25, forming bit lines corresponding to bit lines BLn−1, BLn, BLn+1 of FIG. 1, extend along a second direction (Y-direction), thus transversely to the active area strips 12. Each first metal line 25 is in contact with the chalcogenic storage elements 24 that are aligned in the Y direction, as visible from the cross-section of FIG. 5. The first metal lines 25 are formed preferably in a first metal level.

The second contacts 23 are higher than the first contacts 22 and extend each from a base contact region 15 to second metal lines 26. The second metal lines 26, forming word lines corresponding to word lines WLn−1, WLn, WLn+1 of FIG. 1, extend along the first direction (X-direction), thus parallel to the active area strips 12 and perpendicular to the first metal lines 25. Each second metal line 25 is in contact with the second contacts 23 that are aligned in the X direction, as visible from the cross-section of FIG. 4. The second metal lines 26 are formed preferably in a second metal level.

FIG. 3 shows some masks to be used for manufacturing the memory array of FIGS. 4 and 5. In particular, FIG. 3 shows an active area mask 30, a contact mask 31 and an emitter mask 32.

The process for manufacturing the memory array of FIGS. 4 and 5 is the following.

Figure 6:
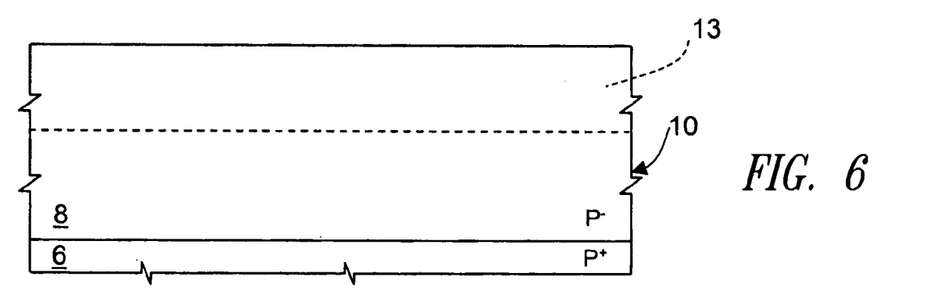
FIGS. 6–11 illustrate cross-sections taken along the same section plane of FIG. 4 through a portion of a semiconductor wafer in subsequent manufacturing steps of a bipolar transistor of the cell array according to the invention.

As shown in FIG. 6, the process starts from a semiconductor body or wafer 10 having a surface 10a and including a substrate 6 and an epitaxial layer 8, both of P-type, wherein the substrate 6 has a high doping (for example, higher than $10^{19}$ atoms/cm$^3$) and the epitaxial layer has a low doping (for example, about $10^{15}$ atoms/cm$^3$).

First of all, field oxide regions 13 (shown with dotted lines in FIG. 6 and visible from the cross-section of FIG. 9) are formed in a per se known manner in the epitaxial layer 8, using the active area mask 30 of FIG. 3, and thus laterally delimiting the active area strips 12.

Figure 12:
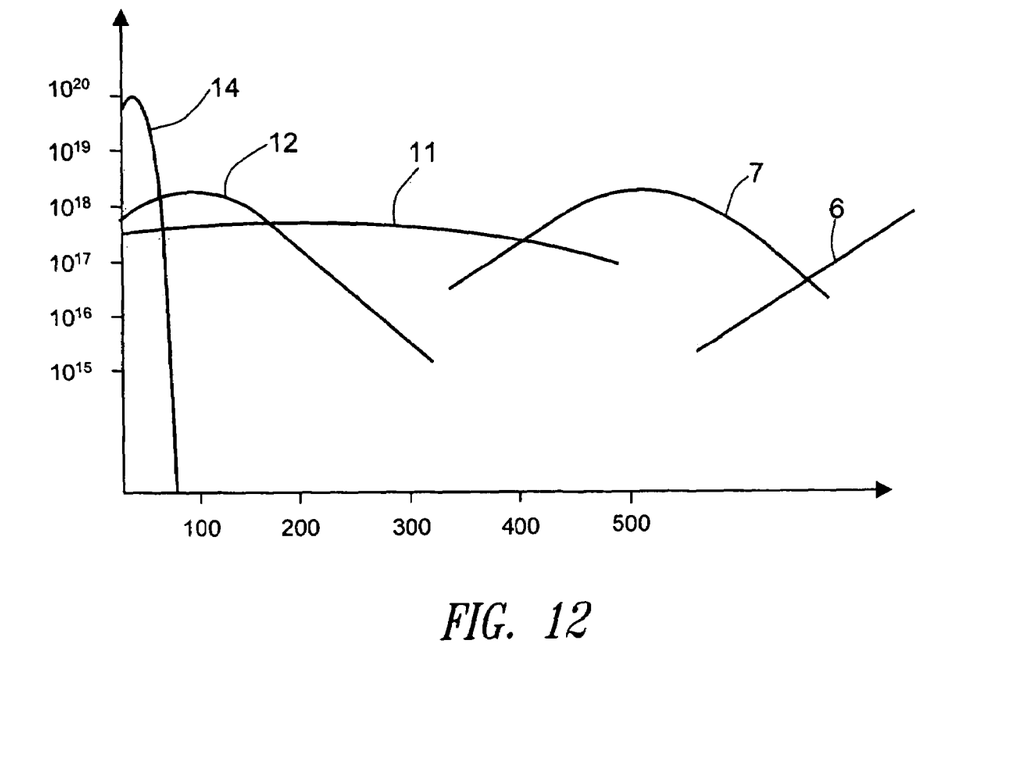
FIG. 12 shows the doping profile for the bipolar transistor of FIG. 4.

Then boron is implanted at high energy at a dose of $10^{13}$–$10^{14}$ atoms/cm$^2$ (FIG. 7) so that, at the end of annealing, the subcollector region 7 extends at a depth comprised between 400 and 850 nm from the surface 10a of the semiconductor body 10 and has a doping level comprised between $10^{17}$ and $10^{19}$ atoms/cm$^3$, with a peak at a depth of about 0.55 μm (see also FIG. 12). Thereby, a maximum resistance of about 500 Ω and thus a maximum voltage drop of 100 mV (for a collector current of 200 μA during a reset pulse) are ensured.

Figure 7:
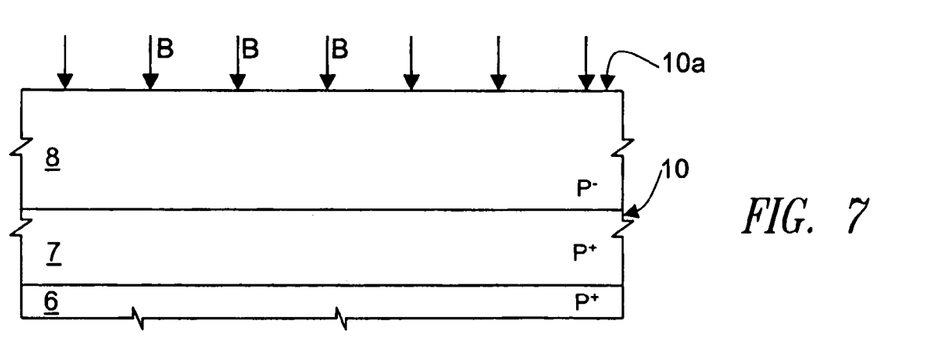

After annealing, a P-well is implanted in the array part of the device, forming the common collector region 11, extending at a depth comprised between 200 and 400 nm from the surface 10a. Since the common collector region 11 should sustain a high current density and thus high level injection effects (e.g., Kirk effect) have to be carefully prevented, the doping level of the common collector region 11 is quite high, of the order of $10^{17}$–$10^{18}$, with a peak of about $10^{18}$ at a depth of about 0.25 μm.

Figure 8:
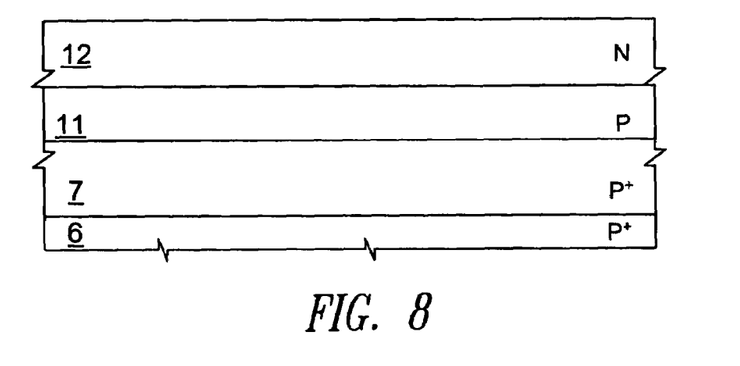
Figure 9:
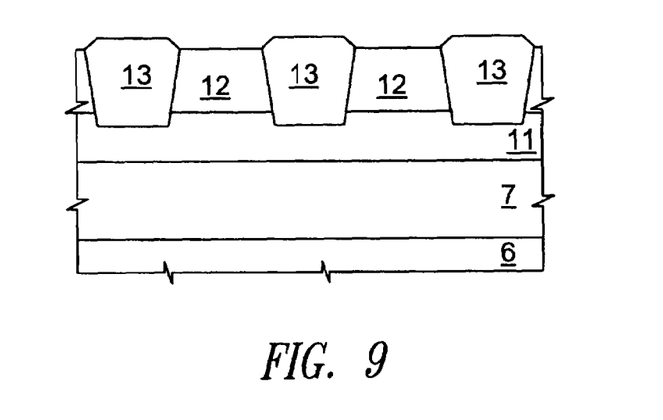

Thereafter, FIGS. 8, 9, the active area strips 12 are implanted with N-type doping agents, thus forming the base regions of bipolar transistors extending down from the surface 10a to about 170 nm. Conveniently, arsenic with an energy of 150–300 keV, preferably about 200 keV is implanted, so as to obtain a final doping level of between $5*10^{17}$ and $5*10^{18}$ atoms/cm$^3$. Thereby it is ensured that the base regions 12 have a shallower depth than the field oxide regions 13 and thus that there is an effective insulation between adjacent wordlines.

Furthermore, the base thickness and peak doping represent a good tradeoff between two conflicting requirements: on one hand, they should be low, so as to achieve a low base Gummel number and thus a high gain; on the other hand, they should be high to avoid the risk of pinch-off when a positive voltage is applied to the wordline (to deselect it) and to reduce to a minimum any leakage of the collector-base and emitter-base junctions. Moreover, the use of arsenic as a doping agent and the selected energy further insure a very sharp doping profile, thereby reducing the risk of pinch off while keeping the base-collector junction as shallow as possible (in particular it has to be shallower than the field oxide isolation).

Figure 10:
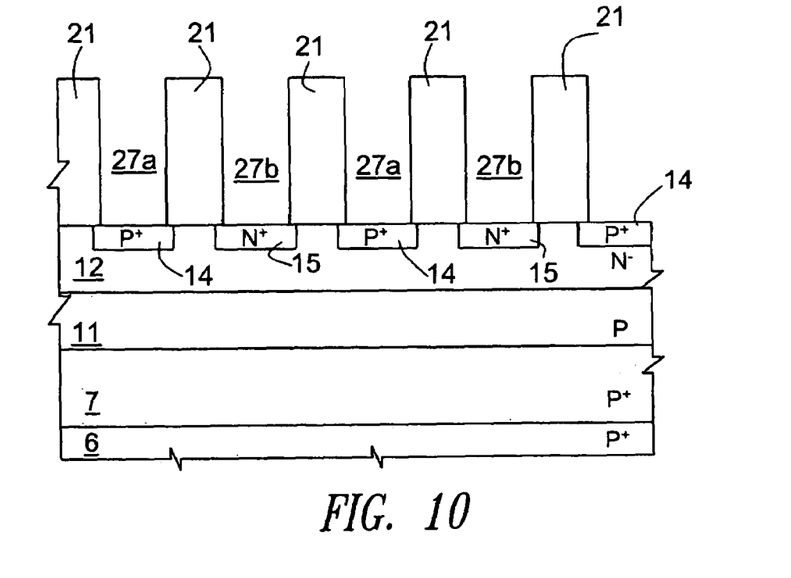

Thereafter, FIG. 10, the body 10 is covered by a first layer of insulating material, forming the bottom portion of the dielectric region 21, and contacts are opened using contact mask 31 of FIG. 3, thereby forming the first openings 27a and the bottom portion of the second openings 27b. Then, a boron implant (P$^+$-emitter implant) is made, using emitter mask 32, so as to form emitter regions 14 with a doping level of about $10^{19}$–$10^{20}$ atoms/cm$^3$ below the first contacts 22. The emitter implant is studied so as to keep the emitter regions 14 as shallow and as abrupt as possible (preferably, the emitter regions 14 have a depth of about 50 nm). Thus, BF$_2$ is selected for the implant, thereby reducing channeling (through amorphization) and ensuring a shallow implant without using a very low energy implant ($^{11}$B at energy in the range of 1 KeV).

Thereafter, using an own mask not shown, that is the negative of the emitter mask 32, base contact regions 15 are implanted below the second contacts 23 using arsenic (or even phosphorus). In case, the base contact regions 15 may be doped before the emitter regions 14.

The obtained doping profile of the various regions is shown in FIG. 12.

Figure 11:
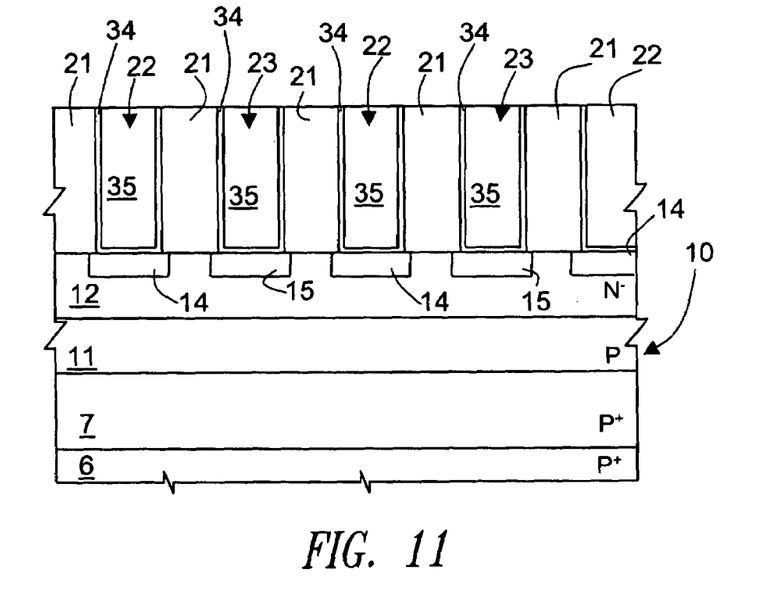

Then, FIG. 11, the first openings 27a and the bottom part of the second openings 27b are filled with a barrier layer 34, e.g., Ti/TIN, and with tungsten 35.

The process continues with the necessary steps to form the memory elements, including forming the chalcogenic storage elements 24, the first metal lines 25, the second metal lines 26, the upper portion of the dielectric region 21 and the upper portion of the second contacts 23, e.g., as described in U.S. patent application Ser. No. 10/313,991, filed on Dec. 5, 2002 and entitled Small Area Contact Region, High Efficiency Phase Change Memory Cell and Fabrication Method Thereof, which is incorporated by reference herein in its entirety, to obtain the structure shown in FIGS. 4 and 5.

Alternatively, instead of the chalcogenic storage elements 24, other storage elements or other two- or three-terminal elements that are compatible with standard CMOS back-end processes may be formed.

According to a different embodiment, a doped region 28 of N type, having a higher doping level than the active area strips 12, is formed below each emitter region 14, as shown by broken lines in FIG. 4. In this case, an N conductivity type determining agent, e.g., arsenic, is implanted using a dose close to that used for the active area strips 12 and employing the emitter mask 32, just after or just before the P$^+$ emitter implant. Thereby, the base resistance and thus the emitter-to-base voltage drop are reduced, increasing also the immunity of the bipolar transistor against emitter-to-collector leakage and punch-through.

Figure 13:
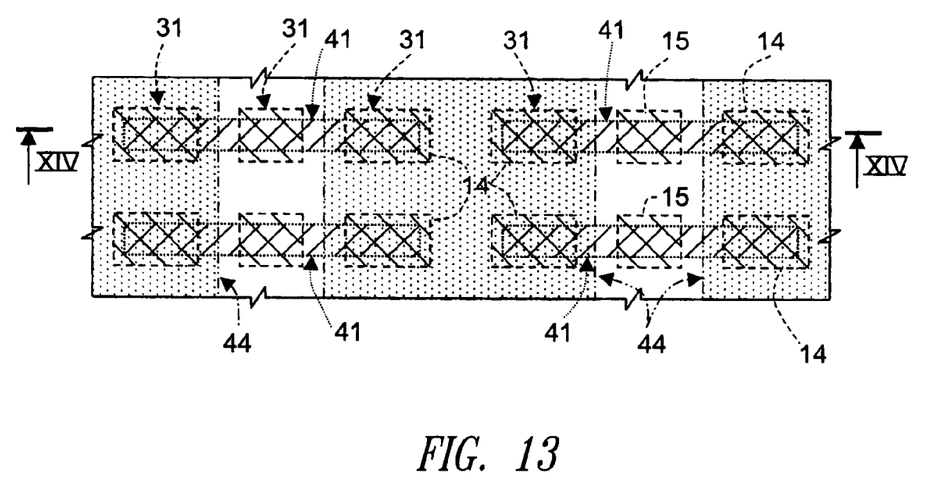
FIG. 13 shows the masks used for manufacturing a bipolar transistor according to a second embodiment of the invention.
Figure 14:
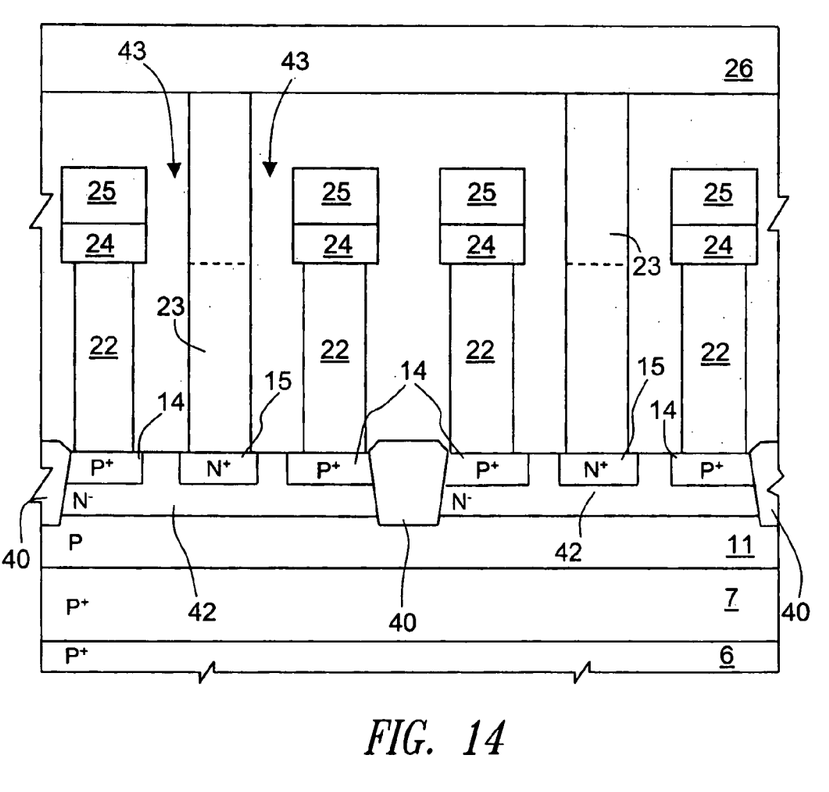
FIG. 14 is a cross-section of the second embodiment, taken along line XIV—XIV of FIG. 13.

FIGS. 13, 14 show a different layout for a memory array having a selection element formed as a high-gain transistor, as above discussed. Here, in the X-direction, each emitter region 14 is separated by the adjacent emitter regions 14 by a base contact region 15 on one side (left in the drawings), and by a field oxide region 40 on the other side (right in the drawings). As shown, the active area mask 41 (FIG. 13) has an grid-like pattern, and a field oxide region 40, having a grid-like shape, delimits a plurality of active regions 42 of rectangular shape. Each active region 42 accommodates only one base contact region 15 and two emitter regions 40, arranged on different sides of the base contact region 15 in the X-direction. Thus, each active region 42 accommodates two bipolar transistors 43 that share a same base contact region 15.

The cross-section in a plane perpendicular to that of FIG. 14 is the same as in FIG. 5.

As visible from FIG. 13, the shape of the active area mask 41 and that of the emitter mask 44 differ from the active area mask 30 and the emitter mask 32 of FIG. 3; however, contact mask 31 is about the same as in FIG. 3.

The manufacturing process, the doping levels and energies of the memory array of FIGS. 13 and 14 are the same described above with reference to FIGS. 3–12, with the only exception of the shape of the active area mask 41 and the emitter mask 44, as above outlined.

Also in the embodiment of FIGS. 13 and 14 a N-doped region 28 (not shown) may be provided below the emitter region 14, to reduce the base resistance and improve punch-through immunity.

With the embodiment of FIGS. 13 and 14, it is possible to save around 20% of silicon area with respect to the embodiment of FIGS. 3–5, even if the active area corners could introduce defectiveness issues.

Figure 15:
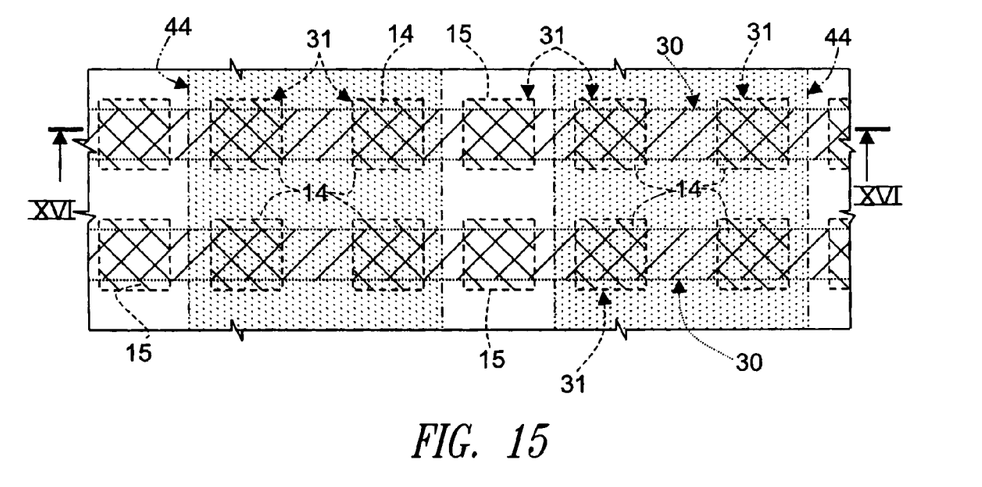
FIG. 15 shows the masks used for manufacturing a bipolar transistor according to a third embodiment of the invention.
Figure 16:
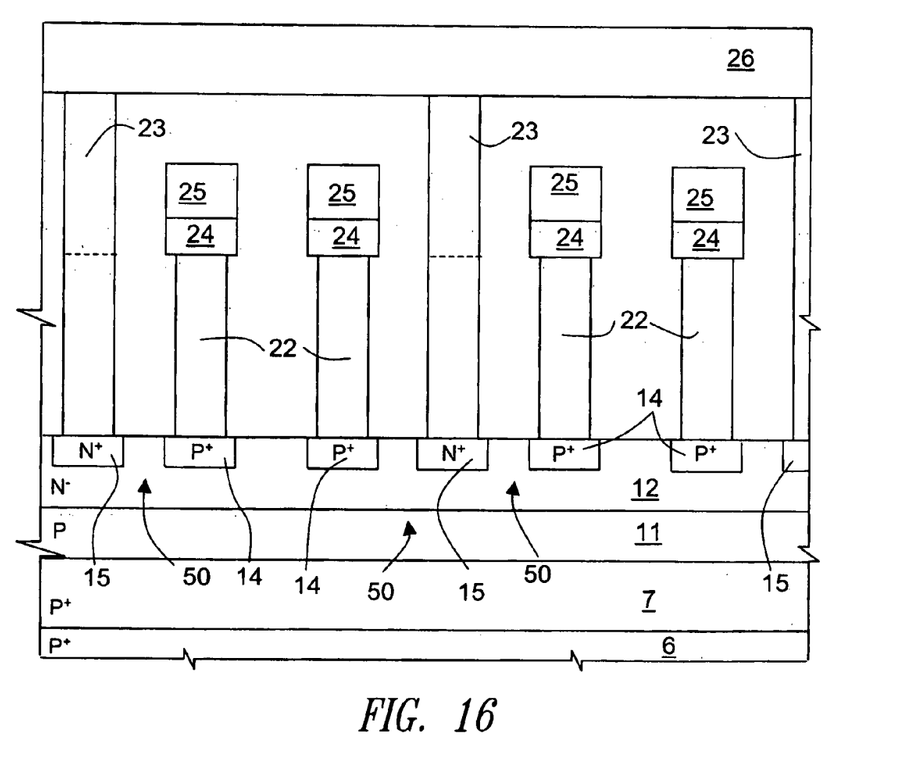
FIG. 16 is a cross-section of the third embodiment, taken along line XVI—XVI of FIG. 15.

FIGS. 15 and 16 show a third embodiment, wherein adjacent emitter regions 14 are not separated by other formations (base contacts or insulating material), but their electrical separation is only ensured by the intrinsic base region (active area strips 12).

Specifically, here the active areas are formed as active area strips 12, analogously to the embodiment of FIGS. 3–5; but each base contact region 15 is formed every two emitter regions 14, analogously to the embodiment of FIGS. 13 and 14. Thus, each base contact region 15 forms two bipolar transistors 50 with the adjacent emitter regions 14.

The mask used to obtain the structure of FIG. 16 are shown in FIG. 15: as may be noted, the active area mask 30 is the same as in FIG. 3 and the emitter mask 44 is the same as in FIG. 13.

The manufacturing process of the memory array of FIGS. 15 and 16 is the same described above with reference to FIGS. 3–5, with the only exception of the shape of the emitter mask 44, as above outlined.

In the embodiment of FIGS. 15 and 16, it is possible to further reduce the area occupation, depending on the minimum distance attainable between two adjacent emitter regions 14; however, the presence of lateral parasitic PNP bipolar transistors (formed by two adjacent emitter regions 14 and the intermediate portion of the respective active area strip 12) renders this embodiment applicable only to solution including design measure to reduce the resulting leakage current.

According to a different embodiment, more than two emitter regions 14, e.g., four, eight, etc., may be arranged between consecutive base contact regions 15 without an oxide or base isolation between them. In this case, the area occupation is still reduced, but the current leakage problem is worsened and base resistance could become a limiting factor for the emitters located farther from the base contact.

Some advantages of some embodiments of the present invention are the following.

The doping of the emitter regions 14 and base contact regions 15 through the openings formed in the dielectric layer 21 ensures self-alignment of these regions, and thus avoids the risk of short-circuit between them in case of mask misalignment.

The high doping of the subcollector 7 and its location directly on the substrate to connect the high doped common collector region 11 with the boron diffusing from the highly doped substrate 6 are very useful to reduce the voltage drop.

Also the high doping of the common collector region 11 ensures the latter to withstand a high current density, as is preferable for a selection element operating as a proper bipolar transistor; thereby effects due to high-level injection (such as Kirk effect) are prevented.

The given values for the base doping and the use of arsenic as a dopant ensure a good tradeoff among the various requirements, in particular as regards electrical insulation between adjacent wordlines, high gain, pinch-off and current leakages.

The implementation of a high gain bipolar transistor allows a reduction in the current flowing in the selected wordline, and thus a reduction in the area necessary to integrate the row decoders. The reduced wordline current reduces the voltage drop on the wordline, allowing a lower voltage operation as well as allows the implementation of longer wordlines, that is the possibility of selecting more bits with a single wordline, allowing for a more efficient memory area.

The reduced rowline current allows for less current density in minimum width wordlines, and thus an improved reliability.

Finally, it is clear that numerous variations and modifications may be made to the cell array as described and illustrated herein, all falling within the scope of the invention as defined in the attached claims.

E.g., it is possible to arrange multiple emitter regions 14 at each side of a base contact region 15 also in the embodiments of FIGS. 3–5 and 13–14, thus reducing the area occupation, while worsening current leakage due to parasitic components.

Furthermore, as indicated, the same array layout may be used for cells including a different storage component.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A cell array, comprising a plurality of cells, each cell including a selection bipolar transistor and a storage component, each said selection bipolar transistor having a first, a second and a control region, and each said storage component having a first and a second terminal, said first region of each bipolar transistor being connected to said first terminal of a respective one of the storage components, said cell array comprising a body of semiconductor material including:
   a common conduction region of a first conductivity type, forming said second regions of said selection bipolar transistors;
   a plurality of active area regions of a second conductivity type and a first doping level, overlying said common conduction region and forming said control regions of said selection bipolar transistors;
   a plurality of second conduction regions of said first conductivity type formed in said active area regions and forming said first regions of said selection bipolar transistors; and
   a plurality of control contact regions of said second conductivity type and a second doping level, higher than said first doping level, formed in said active area regions and connected to biasing lines.

2. A cell array according to claim 1 wherein said bipolar transistor is of PNP type, said common region is a collector region, said second conduction regions are emitters of said bipolar transistors.

3. A cell array according to claim 2 wherein said active area regions are doped with arsenic and said first doping level of said active area regions is between $5*10^{17}$ and $5*10^{18}$ atoms/cm$^3$.

4. A cell array according to claim 2 wherein said body comprises a substrate extending below said common conduction region and having said first conductivity type and a third doping level, and a subcollector region extending between said substrate and said common conduction region, said subcollector region having said first conductivity type and a doping level higher than said common conduction region.

5. A cell array according to claim 4 wherein said subcollector region has a doping level comprised between $10^{18}$ and $10^{19}$ atoms/cm$^3$.

6. A cell array according to claim 4 wherein said common conduction region has a doping level comprised between $10^{17}$ and $10^{18}$ atoms/cm$^3$.

7. A cell array according to claim 1 wherein said second conduction regions have a doping level of about $10^{19}$–$10^{20}$ atoms/cm$^3$.

8. A cell array according to claim 1 wherein said storage component is a phase change memory element.

9. A memory device, comprising:
   a storage component having first and second terminals; and
   a selection bipolar transistor having a first conduction region, a second conduction region, and a base region, the first conduction region of the bipolar transistor being connected to the first terminal of the storage component, the bipolar transistor including:
  a semiconductor body of a first conductivity type, forming the second conduction region of the bipolar transistor;
  a first active region of a second conductivity type, overlying the semiconductor body and forming the base region of the bipolar transistor;
  a first base contact region of the second conductivity type and a doping level that is higher than a doping level of the first active region, formed in the first active region and connected to a biasing line;
  the first conduction region of the first conductivity type formed in, and surrounded by, the active region, the first conduction region being spaced laterally apart from the base contact region by a first portion of the active region and forming a first region of the bipolar transistor; and
  a first conductive contact positioned on the first conduction region and connected between the first conduction region and the storage component.

10. The memory device of claim 9 wherein the bipolar transistor and storage component comprise a first memory cell of a memory array of memory cells that includes a second memory cell having a second storage component and second bipolar transistor that includes:
  a second active region of the second conductivity type, overlying the semiconductor body and forming a base region of the second bipolar transistor;
  a second base contact region of the second conductivity type and a doping level that is higher than a doping level of the second active region, formed in the second active region and connected to the biasing line;
  a second conduction region of the first conductivity type formed in, and surrounded by, the second active region, the second conduction region being spaced laterally apart from the second base contact region by a portion of the second active region and forming a first region of the second bipolar transistor; and
  a second conductive contact positioned on the second conduction region and connected between the second conduction region and the second storage component.

11. The memory device of claim 10, further comprising a first field insulation region separating the first active region from the second active region.

12. The memory device of claim 11, further comprising:
  a second field insulation region positioned on an opposite side of the first active region from the first field insulation region;
  a third storage component; and
  a third bipolar transistor that includes:
    a third conduction region of the first conductivity type formed in, and surrounded by, the first active region, the second conduction region being spaced laterally apart from the first base contact region by a second portion of the first active region and forming a first region of the third bipolar transistor, the first and second portions of the first active region being positioned immediately adjacent to opposite sides of the first base contact region; and
    a third conductive contact positioned on the third conduction region and connected between the third conduction region and the third storage component.

13. The memory device of claim 9 wherein the semiconductor body comprises:
  a semiconductor substrate having the first conductivity type;
  a common conduction region positioned immediately below the first active region and having the first conductivity type; and
  a subcollector region extending between the substrate and the common conduction region, the subcollector region having the first conductivity type and a doping level higher than a doping level of the common conduction region.

14. The memory device of claim 13 wherein the subcollector region has a doping level comprised between $10^{18}$ and $10^{19}$ atoms/cm$^3$ and the common conduction region has a doping level comprised between $10^{17}$ and $10^{18}$ atoms/cm$^3$.

15. The memory device of claim 9 wherein the storage component is a phase change memory element.

16. A memory cell array, comprising:
  a plurality of storage elements; and
  a plurality of selection transistors including:
    a semiconductor body of a first conductivity type;
    a plurality of active area regions of a second conductivity type and a first doping level, overlying the semiconductor body and forming control regions of the selection transistors;
    a plurality of first conduction regions of the first conductivity type formed in the active area regions and respectively forming first conducting regions of the selection transistors;
    a plurality of control contact regions of the second conductivity type and a second doping level, higher than the first doping level, formed in the active area regions; and
    a plurality of second conduction regions of the selection transistors, the second conduction regions being respectively coupled to the active regions, wherein each storage element is positioned directly above a respective one of the first conduction regions and is coupled to the respective first conduction region by a respective one of a plurality of conductive contracts.

17. The memory cell array of claim 16 wherein each selection transistor is a PNP transistor, the second conduction regions are collector regions, the first conduction regions are emitter regions, and the active areas are base regions.

18. The memory cell array of claim 16 wherein the second conduction regions are contiguous with one another and form a common conduction region.

19. The memory cell array of claim 18 wherein the semiconductor body includes:
  a substrate extending below the common conduction region and having the first conductivity type; and
  an intervening conduction region extending between the substrate and the common conduction region, the intervening conduction region having the first conductivity type and a doping level higher than the common conduction region.

20. The memory cell array of claim 16 wherein the storage components are a phase change memory elements.

21. The memory cell array of claim 16 wherein each control contact regions is associated with two of the first conduction regions such that each of the control contact regions is part of two selection transistors formed respectively with the two associated conduction regions.

22. The memory cell array of claim 16 wherein the first conduction regions include a plurality of pairs of first conduction regions that are each positioned between two consecutive regions of the control contact regions.

23. The memory cell array of claim 22, further comprising a plurality of insulating regions positioned between the first conduction regions of each pair of first conduction regions.

24. The memory cell array of claim 16, further comprising a plurality of conductive biasing lines each connected to a plurality of the first conduction regions.

25. A memory cell array, comprising:
a plurality of storage elements; and
a plurality of selection transistors including:
　a semiconductor body of a first conductivity type;
　a plurality of active area regions of a second conductivity type and a first doping level, overlying the semiconductor body and forming control regions of the selection transistors;
　a plurality of first conduction regions of the first conductivity type formed in the active area regions and respectively forming first conducting regions of the selection transistors;
　a plurality of control contact regions of the second conductivity type and a second doping level, higher than the first doping level, formed in the active area regions, wherein each control contact region is associated with two of the first conduction regions such that each of the control contact region is part of two selection transistors formed respectively with the two associated conduction regions; and
　a plurality of second conduction regions of the selection transistors, the second conduction regions being respectively coupled to the active regions.

26. The memory cell array of claim 25 wherein each selection transistor is a PNP transistor, the second conductive regions are collector regions, the first conduction regions are emitter regions, and the active areas are base regions.

27. The memory cell array of claim 25 wherein the second conduction regions are contiguous with one another and form a common conduction region.

28. The memory cell array of claim 25 wherein the storage elements are phase change memory elements.

* * * * *